United States Patent
Lee et al.

(10) Patent No.: US 6,893,791 B2
(45) Date of Patent: May 17, 2005

(54) PHOTORESIST COMPOSITION AND METHOD OF FORMING PATTERN USING THE SAME

(75) Inventors: You-Kyoung Lee, Suwon-si (KR); Sung-Chul Kang, Seongnam-si (KR); Jin-Ho Ju, Seoul (KR); Dong-Ki Lee, Seoul (KR); Seung-Uk Lee, Seoul (KR); Hoon Kang, Seoul (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/259,152

(22) Filed: Sep. 27, 2002

(65) Prior Publication Data
US 2003/0165770 A1 Sep. 4, 2003

(30) Foreign Application Priority Data
Jan. 5, 2002 (KR) .......................................... 2002-625

(51) Int. Cl.⁷ ............................. G03F 7/023; G03F 7/30
(52) U.S. Cl. ...................... 430/191; 430/165; 430/192; 430/193; 430/326
(58) Field of Search ................................ 430/165, 191, 430/192, 193, 326

(56) References Cited

U.S. PATENT DOCUMENTS

| | | | | |
|---|---|---|---|---|
| 5,008,175 A | * | 4/1991 | Hsieh et al. ................. | 430/155 |
| 5,225,310 A | * | 7/1993 | Stahlhofen et al. ......... | 430/165 |
| 6,165,677 A | * | 12/2000 | Yako ....................... | 430/270.1 |
| 6,329,110 B1 | * | 12/2001 | Nunomura et al. .......... | 430/18 |
| 6,365,306 B1 | * | 4/2002 | Nunomura et al. .......... | 430/18 |
| 6,514,658 B2 | * | 2/2003 | Nunomura et al. ......... | 430/191 |

* cited by examiner

Primary Examiner—John S. Chu
(74) Attorney, Agent, or Firm—F. Chau & Associates, LLC

(57) ABSTRACT

Disclosed is a photoresist composition having a good sensitivity and residual layer characteristic and a method of forming a pattern using the same. The photoresist composition includes 5–30% by weight of a polymer resin, 2–10% by weight of a photosensitive compound, 0.1–10% by weight of a sensitivity enhancing agent, 0.1–10% by weight of a sensitivity restraining agent and 60–90% by weight of an organic solvent. A photoresist layer is formed by coating the photoresist composition on a substrate and then drying the coated photoresist composition. Then, thus obtained photoresist layer is exposed by using a mask having a predetermined pattern. Then, a photoresist pattern is formed by developing thus exposed photoresist layer. The photoresist pattern exhibits a uniform layer thickness and critical dimension.

25 Claims, 2 Drawing Sheets

PHOTORESIST COMPOSITION AND METHOD OF FORMING PATTERN USING THE SAME

BACKGROUND OF THE INVENTION

1. Field of the Invention

The present invention relates to a photoresist composition and a method of forming a pattern using the same, and more particularly to a photoresist composition having good sensitivity and residual layer characteristics.

2. Description of the Related Arts

Flat panel display devices have become increasingly popular because they are thin, light, and have low power consumption characteristics.

Among the flat panel devices, liquid crystal display (LCD) devices have been widely utilized because in addition to the above advantages, LCD devices are capable of displaying a high quality image. LCD devices are widely used as computer monitors and more recently as television units.

As LCD devices become larger, manufacturing becomes more complex. One reason is because the need for an enlarged glass, and the need to use a photoresist composition satisfying new process conditions, such as, processes for fabricating the fine featured patterns of circuits.

In general, photoresist composition characteristics such as photoresist layer sensitivity, developing contrasts, photoresist layer resolution, adhesiveness of underlying layers including substrates, and residual layer characteristics of the photoresist layer directly or indirectly influence the quality of the devices.

A conventional method of forming photoresist patterns is performed by using a common photolithography and photoresist composition. The method involves first forming a photoresist layer by applying a photoresist composition on a substrate. A mask having a predetermined pattern to selectively expose a predetermined portion of the photoresist layer is positioned above the photoresist layer and the photoresist layer is exposed to light through the mask. Then, a portion having a high solubility (the exposed portion for a positive photoresist) is typically removed by using a developing solution (typically referred to as development process) and a portion having a low solubility remains, to thereby obtain a photoresist pattern. Then, the exposed portions are etched to form a pattern on the substrate, and the remaining photoresist is removed to obtain a desired pattern such as a wire or an electrode.

U.S. Pat. Nos. 3,046,118, 3,106,465, 3,148,983, 4,115,128, and 4,173,470 and Japanese Patent Laid-open Publication No. Sho 62-28457 disclose a photoresist polymer having a novolak resin of cresol-formaldehyde and a naphthoquinone diazide-substituted photosensitive material. U.S. Pat. No. 5,648,194 discloses a photoresist composition containing alkali-soluble resins, o-naphthoquinone diazide sulfonic acid ester, and vinyl ether. U.S. Pat. No. 5,468,590 discloses a photoresist compositions containing alkali-soluble resins prepared by using quinone diazide compounds and polyphenol. U.S. Pat. No. 5,413,895 discloses a photoresist polymer having novolak resins, quinone diazide compounds, and polyphenol.

Generally, the photoresist polymer should have characteristics of: high sensitivity to light and good residual layer characteristic, despite their complementary relationship. Sensitivity means a changing rate of the solubility of a photoresist layer into a developing solution after exposure to light. The residual layer characteristic means a ratio of a thickness of a residual layer after developing with respect to an original thickness of the photoresist layer. Typically, as sensitivity increases, the residual layer characteristic is deteriorated. Accordingly, it would be highly desirable to develop photoresist compositions having both high sensitivity and good residual layer characteristic.

SUMMARY OF THE INVENTION

A photoresist composition is provided, which includes about 5% to about 30% by weight of a polymer resin, about 2% to about 10% by weight of a photosensitive compound, about 0.1% to about 10% by weight of a sensitivity enhancing agent, about 0.1% to about 10% by weight of a sensitivity restraining agent, and about 60% to about 90% by weight of an organic solvent.

According to an embodiment of the present invention, the polymer resin is a novolak resin having a molecular weight in the range of about 2,000 to about 12,000. The novolak resin is polymerized by reacting an aromatic alcohol compound with an aldehyde compound under an acid catalyst. The aromatic alcohol compound is selected from the group consisting of phenol, m-cresol, p-cresol, o-cresol, xylenol, alkyl phenol, alkoxy phenol, isopropenyl phenol, polyhydroxy phenol, and their mixtures. The aldehyde compound is selected from the group consisting of formaldehyde, paraformaldehyde, acetaldehyde, propionaldehyde, butylaldehyde, trimethyl actetaldehyde, benzaldehyde, terephtalaldehyde, phenylacetaldehyde, hydroxybenzaldehyde, and their mixtures. The acid catalyst is selected from the group consisting of inorganic acids of hydrochloric acid, hydrosulfuric acid, or phosphoric acid and organic acids of acetic acid, p-toluene sulfonic acid, and oxalic acid. The photosensitive compound is a diazide-based compound. The photosensitive compound is a sulfonate compound selected from the group consisting of 2,3,4,4'-tetrahydroxy benzophenone-1,2-naphtoquinone diazide-4-sulfonate, 2,3,4,4'-tetrahydroxy benzophenone-1,2-naphtoquinone diazide-5-sulfonate, 2,3,4,4'-tetrahydroxy benzophenone-1,2-naphtoquinone diazide-6-sulfonate, and their mixtures. The sulfonate compound is produced through an esterification reaction of 2,3,4,4'-tetrahydroxy benzophenone with 1,2-naphtoquinone diazide. The sensitivity enhancing agent is a polyhydroxy compound having about 2 to about 7 phenol-based hydroxy functional group and a molecular weight of about 1,000 or less.

According to an embodiment of the present invention, the sensitivity enhancing agent is at least one compound selected from the group consisting of the following compounds of:

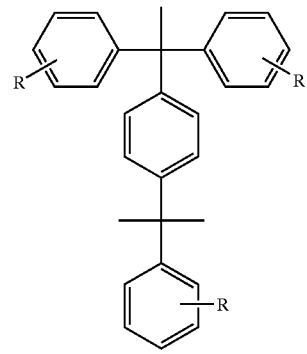

[I]

-continued

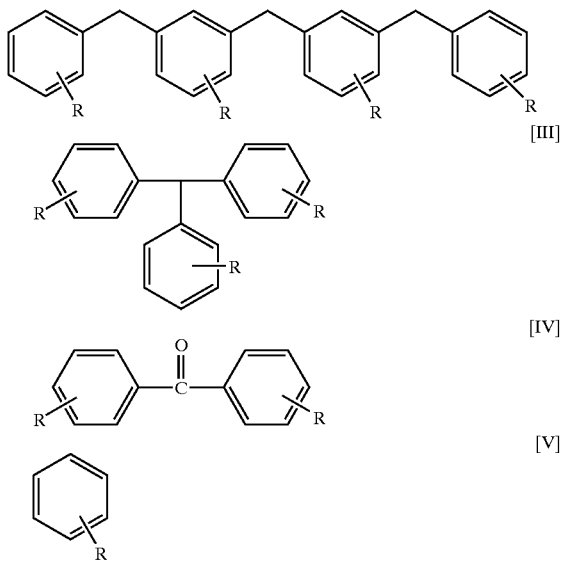

wherein R is independently or simultaneously hydrogen, $(CH_3)_n$, $(CH_2CH_3)_n$, $(OH)_n$, or phenyl, and n is an integer of 0–5. The sensitivity enhancing agent is preferably at least one selected from the group consisting of 2,3,4-trihydroxy benzophenone, 2,3,4,4'-tetrahydroxy benzophenone, 2,3,4,3',4',5'-hexahydroxy benzophenone, acetone-pyrrogallol condensing compound, 4,4-[1-[4-[1-(1,4-hydroxyphenyl)-1-methylethyl]phenyl]ethylidene]bisphenol, and 4,4-[2-hydroxyphenylmethylene]bis[2,6-dimethylphenol]. The sensitivity restraining agent is an aromatic compound having a sulfonyl functional group and a molecular weight of about 1,000 or less.

The sensitivity restraining agent is at least one selected from the group consisting of the following compounds:

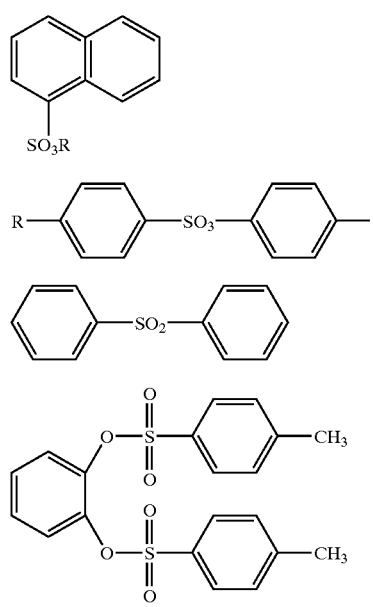

wherein R is independently or simultaneously hydrogen, $(CH_3)_n$, $(CH_2CH_3)_n$, $(OH)_n$, $-SO_3(C_6H_4)CH_3$, or phenyl, and n is an integer of 0–5. The sensitivity restraining agent is preferably at least one selected from the group consisting of 1,2-bisphenyl para-toluenesulfonate, and diphenyl sulfone. The organic solvent is at least one selected from the group consisting of propyleneglycol methylether acetate (PGMEA), ethyl lactate (EL), 2-methoxyethyl acetate (MMP), and propyleneglycol monomethyl ether (PGME). The organic solvent is a mixture of propyleneglycol methylether acetate (PGMEA) and ethyl lactate (EL) in a ratio of about 9:1–7:3 by weight.

According to an embodiment of the present invention, the photoresist composition further includes at least one additive selected from the group consisting of a coloring agent, a dying agent, streation preventing agent, a plasticizer, an adhesion promoting agent, and a surfactant. The photoresist composition is used for fabricating a semiconductor device or a liquid crystal display device.

A method of forming a pattern is provided, which includes the steps of: forming a photoresist layer by coating a photoresist composition on a substrate and then drying; exposing the photoresist layer to a light by using a mask having a predetermined pattern; and forming a photoresist pattern by developing the exposed photoresist layer, wherein the photoresist composition comprises about 5% to about 30% by weight of a polymer resin, about 2% to about 10% by weight of a photosensitive compound, about 0.1% to about 10% by weight of a sensitivity enhancing agent, about 0.1% to about 10% by weight of a sensitivity restraining agent, and about 60% to about 90% by weight of an organic solvent. The step of forming the photoresist layer includes the step of performing a soft bake process at a temperature of about 80° C. to about 130° C. The step of forming the photoresist pattern comprises the step of performing a hard bake process at a temperature of about 90° C. to about 140° C. The photoresist composition is used for fabricating a liquid crystal display device or a semiconductor device. The photoresist composition is coated by a spin coating method.

BRIEF DESCRIPTION OF THE DRAWINGS

The above and other objects and advantages of the present invention will become readily apparent by reference to the following detailed description when considered in conjunction with the accompanying drawings wherein.

DETAILED DESCRIPTION OF PREFERRED EMBODIMENTS

Figure 1A:
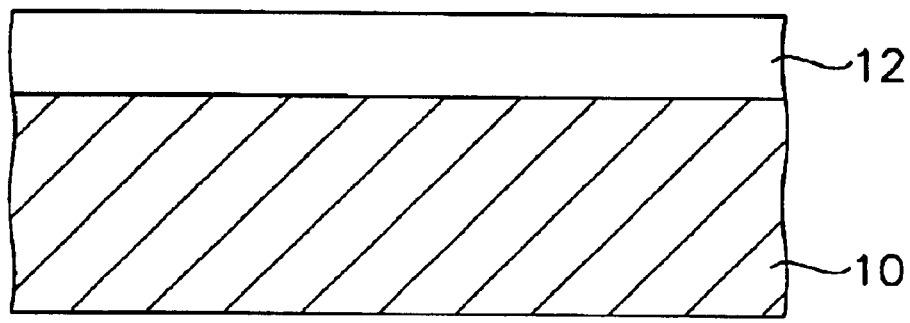
FIGS. 1A–1C are cross-sectional views for explaining a method of forming a pattern using a photoresist composition according to an embodiment of the present invention.

Hereinafter, the embodiments of the present invention will be described in detail with reference to the accompanying drawings.

The present invention provides a photoresist composition used for manufacturing liquid crystal display devices and semiconductor devices. According to an embodiment of the present invention, the photoresist composition includes a novolak resin. The novolak resin is an alkali-soluble resin and a typical example of a resin applicable for a positive-type photoresist composition. The novolak resin is a polymer synthesized by reacting an aromatic alcohol compound with an aldehyde compound under an acid catalyst.

According to an embodiment of the present invention, the aromatic alcohol compound is selected from the group consisting of phenol, cresol such as m-cresol, p-cresol, and o-cresol, xylenol, alkyl phenol, alkoxy phenol, isopropenyl phenol, polyhydroxy phenol, and their mixtures.

The aldehyde compound is selected from the group consisting of formaldehyde, paraformaldehyde, acetaldehyde, propionaldehyde, butylaldehyde, trimethyl actetaldehyde, benzaldehyde, terephtalaldehyde, phenylacetaldehyde, hydroxybenzaldehyde, and their mixtures. Preferably, formaldehyde is used as the aldehyde compound.

The acid catalyst is selected from the group consisting of inorganic acids such as hydrochloric acid, hydrosulfuric acid, phosphoric acid, and the like and organic acids such as acetic acid, p-toluene sulfonic acid, oxalic acid, and the like. Preferably, oxalic acid is used as the acid catalyst.

According to an embodiment of the present invention, the photoresist compound is made by a condensing reaction at a temperature of about 60° C. to about 120° C. for about 2 hours to about 30 hours.

According to an embodiment of the present invention, during the preparation of the novolak resin, when the m-cresol and the p-cresol is used as the aromatic alcohol compound, the mixed ratio of the m-cresol and p-cresol is appropriately controlled to control the physical properties such as a sensitivity and a residual layer characteristic of the photoresist compound as well as to prevent the thermal reflow. The preferred mixed ratio of the m-cresol and the p-cresol for the preparation of the novolak resin is in the range of about 40–60:60–40 by weight. When the mixed amount of m-cresol exceeds the above-limited range, the sensitivity of the photoresist composition is increased and the residual layer characteristic is rapidly deteriorated. While the mixed amount of p-cresol exceeds the above-limited range, the sensitivity is decreased.

The novolak resin of the present invention may have various molecular weights. The novolak resin has number average molecular weight (Mn) of about 2,000–to about 12,000, preferably, about 3,000 to about 4,000, which is a polystyrene converted number average molecular weight obtained by Gel Permeation Chromatography (GPC). When the molecular weight of the novolak resin is less than 2,000, it is difficult to obtain a desired photoresist pattern. When the molecular weight of the novolak resin exceeds 12,000, it is difficult to obtain a uniform coating layer.

The amount of the novolak resin in the photoresist composition of the present invention is in a range of about 5% to about 30% by weight based on the total amount of the composition. Preferably, the amount of the novolak resin in the photoresist composition is in a range about 10% to 20% by weight based on the total amount of the composition. When the amount of the novolak resin is less than 5% by weight, the viscosity of the composition is too low and a photoresist layer having a desired thickness is not obtainable. When the amount of the novolak resin exceeds 30% by weight, the viscosity of the composition is too high, thereby being difficult to form a uniform coating of the photoresist layer on the substrate.

According to an embodiment of the present invention, the photoresist composition further includes a photosensitive compound. Preferably, the photosensitive compound is a diazide-based compound which is a reaction product of polyhydroxy benzophenone with a diazide compound such as 1,2-naphtoquinone diazide and 2-diazo-1-naphtol-5-sulfonic acid. More preferably, the photosensitive compound is a sulfonate compound selected from the group consisting of 2,3,4,4'-tetrahydroxy benzophenone-1,2-naphtoquinone diazide-4-sulfonate, 2,3,4,4'-tetrahydroxy benzophenone-1,2-naphtoquinone diazide-5-sulfonate, 2,3,4,4'-tetrahydroxy benzophenone-1,2-naphtoquinone diazide-6-sulfonate, and their mixtures. The sulfonate compound is produced through an esterification reaction of 2,3,4,4'-tetrahydroxy benzophenone with 1,2-naphtoquinone diazide.

According to an embodiment of the present invention, to control the sensitivity by using the photosensitive compound, two methods are applied. The first method is to control the amount of the photosensitive compound. The second method is to control the esterification degree of the reaction between 2,3,4,4'-tetrahydroxybenzophenone with 1,2-naphtoquinone diazide is controlled when 2,3,4,4'-tetrahydroxy benzophenone-1,2-naphtoquinone diazide sulfonate is used as the photosensitive compound.

According to an embodiment of the present invention, the amount of the photosensitive compound is in a range of about 2% to about 10%, preferably, about 3% to about 7% by weight based on the total amount of the photoresist composition. If the amount of the photosensitive compound is less than 2% by weight, the sensitivity of the composition is very high, thereby deteriorating the residual layer characteristic. If the amount of the photosensitive compound exceeds 10% by weight, the sensitivity is too low, and the forming of pattern becomes difficult.

According to an embodiment of the present invention, the preferred esterification degree of the photosensitive compound is in a range of about 40% to about 100%, preferably, 60% to about 90%. If the esterification degree is less than about 40%, the sensitivity is increased; in contrast, the thickness of the photoresist layer after the developing process is thin.

According to an embodiment of the present invention, the photoresist composition further includes a sensitivity enhancing agent to increase the sensitivity of the composition. The sensitivity enhancing agent includes a polyhydroxy compound having a number of about 2 to about 7 phenol-based hydroxy functional group and a molecular weight of about 1,000 or less. Preferably, the sensitivity enhancing agent is at least one compound selected from the group consisting of the following compounds, wherein R is independently or simultaneously hydrogen, $(CH_3)_n$, $(CH_3CH_2)_n$, $(OH)_n$, or phenyl, and n is an integer of 0–5.

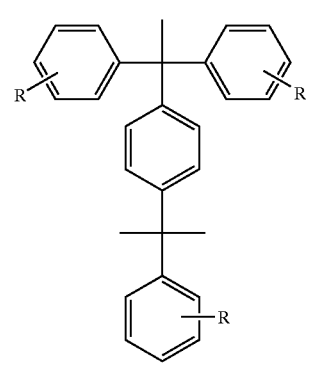

[I]

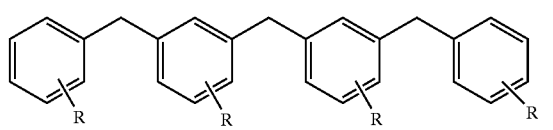

[II]

-continued

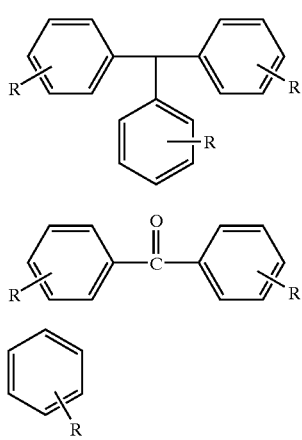

[III]

[IV]

[V]

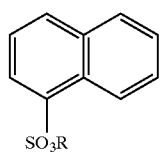

[VI]

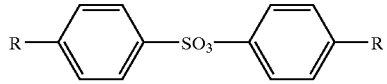

[VII]

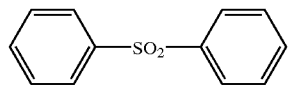

[VIII]

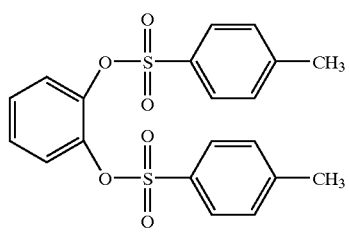

[IX]

More preferably, the sensitivity enhancing agent is at least one selected from the group consisting of 2,3,4-trihydroxy benzophenone, 2,3,4,4'-tetrahydroxy benzophenone, 2,3,4,3',4',5'-hexahydroxy benzophenone, acetone-pyrrogallol condensing compound, 4,4-[1-[4-[1-(1,4-hydroxyphenyl)-1-methylethyl]phenyl]ethylidene]bisphenol and 4,4-[2-hydroxyphenylmethylene]bis[2,6-dimethylphenol]. Most preferably, 4,4-[1-[4-[1-(1,4-hydroxyphenyl)-1-methylethyl]phenyl]ethylidene]bisphenol or 2,3,4-trihydroxy benzophenone can be used.

The sensitivity enhancing agent has a low molecular weight of about 1000 and has an alcohol functional group therein similar that of the novolak resin. Therefore, the solubility of the exposed portion of the photoresist layer during developing is increased owing to the sensitivity-enhancing agent.

According to an embodiment of the present invention, the amount of the sensitivity enhancing agent is in a range of about 0.1% to about 10%, preferably, about 1% to about 5% by weight. If the amount of the sensitivity enhancing agent is less than 0.1% by weight, the sensitivity enhancement effect is too weak and if the amount of the sensitivity enhancing agent exceeds about 10% by weight, the solubility of the non-exposed portion of the photoresist layer during developing is increased, thereby lowering the residual layer characteristic.

According to an embodiment of the present invention, the photoresist composition further includes a sensitivity restraining agent. The sensitivity restraining agent restrains the sensitivity of the photoresist layer to increase the residual layer characteristic and developing contrast. The sensitivity restraining agent includes an aromatic compound having a sulfonyl functional group and the molecular weight of the sensitivity restraining agent is about 1,000 or less. Preferably, the sensitivity restraining agent is at least one selected from the group consisting of the following compounds, wherein R is independently or simultaneously hydrogen, $(CH_3)_n$, $(CH_3CH_2)_n$, $(OH)_n$, —$SO_3(C_6H_4)CH_3$, or phenyl, and n is an integer of 0–5.

The sensitivity restraining agent includes a sulfonyl functional group. In contrast to the sensitivity enhancing agent, this sulfonyl functional group reduces the solubility of the non-exposed portion of the photoresist layer during development. That is, the sulfonyl functional group forms a binding within the reaction product of an azo coupling reaction of nitro functional group contained in the photosensitive compound to restrain the production of a compound having a good dissolving power with respect to the developing solution. As a result, the insolubility of the non-exposed portion is increased. That is, when the sensitivity enhancing agent increases the solubility of the exposed portion during developing, the sensitivity restraining agent decreases the solubility of the non-exposed portion during the developing, thereby satisfying the physical properties of increasing the sensitivity and residual layer characteristic at the same time.

According to an embodiment of the present invention, the amount of the sensitivity restraining agent is preferably in a range of about 1% to about 10%; more preferably, about 1% to about 3% by weight based on the total amount of the photoresist composition. If the amount of the sensitivity restraining agent is less than 0.1% by weight, an effect obtainable by adding this agent is too weak. If the amount of the sensitivity restraining agent exceeds 10% by weight, the solubility of the exposed portion during developing is deteriorated.

According to an embodiment of the present invention, the photoresist composition further includes an organic solvent which has no reactivity with the photosensitive compound and the novolak resin. However, the solvent should have a sufficient dissolving power and an appropriate drying rate to form uniform and flat coating layer after evaporation thereof. The organic solvent is selected from the group consisting of alkyl lactate-based solvent which has a good dissolving power with respect to the photosensitive compound and the novolak-based resin, acetate-based solvent which has a good layer-forming characteristic, ether-based solvent, and their mixtures thereof.

Preferably, the organic solvent is selected from the group consisting of propylene glycol methylether acetate (PGMEA), ethyl lactate (EL), 2-methoxyethyl acetate (MMP), propyleneglycol monomethyl ether (PGME), and their mixtures. More preferably, PGMEA alone or a mixture of PGMEA and EL in a ratio of about 9:1 to 7:3 by weight is used.

According to an embodiment of the present invention, the photoresist composition further includes at least one additive. The additive includes a coloring agent, a dying agent, a streation preventing agent, a plasticizer, an adhesion promoting agent, and a surfactant for improving certain properties according to each process characteristic.

The method of forming a pattern by using a photoresist composition according to the present invention will be described with reference to FIGS. 1A to 1C.

Referring to FIG. 1A, the photoresist composition according to the present invention is coated on a substrate 10 by a method such as a dipping, spraying, rotation, and spin coating to form a photoresist layer 12. When the spin coating method is applied, the solid content of the composition is appropriately controlled using a spinning apparatus and spinning method to form a coating layer to a desired thickness. The substrate includes an insulating layer, a conductive layer, and another substrate to form a pattern thereon such as silicon, aluminum, indium tin oxide (ITO), molybdenum, silicon dioxide, doped silicon dioxide, silicon nitride, tantalum, copper, polysilicon, ceramic, aluminum/copper mixture, and various polymer resins.

After forming the photoresist layer 12 on the substrate 10, a soft bake process is performed by heating the substrate 10 having the photoresist layer 12 at a temperature of about 80° C. to about 130° C. The soft bake process is to evaporate solvent in the photoresist layer 12 without decomposing solid components contained therein. The concentration of the solvent in the photoresist layer 12 is preferably minimized by the soft bake process. Therefore, the soft bake process is continued until the solvent is almost evaporated. Particularly, for fabricating the liquid crystal display device, the soft bake process is performed until the thickness of the photoresist layer 12 or the substrate 10 is about 2 $\mu$m or less.

Figure 1B:
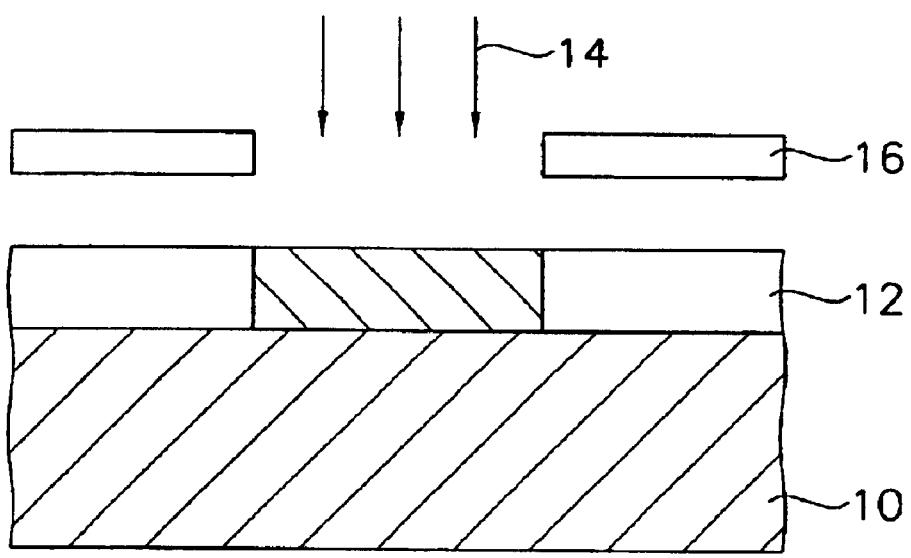

Referring to FIG. 1B, the photoresist layer 12 on the substrate 10 is exposed to light 14 such as ultraviolet by using a frame plate 16 as a mask to selectively expose the photoresist layer 12, thereby forming an alkali-soluble resin which will be dissolved during a subsequent developing process.

Figure 1C:
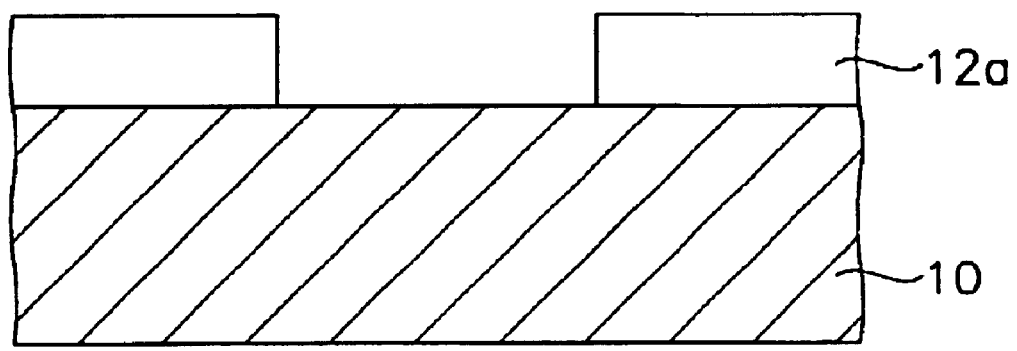

Referring to FIG. 1C, the exposed substrate 10 is dipped into a developing solution (not shown) until the exposed portion of the photoresist layer 12 to the light is dissolved. According to an embodiment of the present invention, the developing solution includes alkaline hydroxide solution, ammonium hydroxide, or tetramethyl ammoniumhydroxide.

After removing the exposed portion of the photoresist layer 12, the substrate 10 is taken from the developing solution. Then, a hard bake process is performed to improve adhesiveness and chemical-resistance of the photoresist layer 12 under a softening point of the photoresist layer; preferably, at a temperature of about 90° C. to about 140° C. After performing the hard bake process, a desired photoresist pattern 12a is obtained.

The substrate 10 on which the photoresist pattern 12a is formed is treated with an etching solution or a gas plasma for etching the exposed portion of the substrate 10 using the photoresist pattern 12a as an etching mask. During the etching process, the unexposed portion of the substrate is protected by the photoresist pattern 12a. After etching, the photoresist pattern 12a is removed by using an appropriate stripper to obtain a fine circuit pattern having a desired shape on the substrate 10.

Preferred examples of the present invention will be described below. It should be understood that the following examples are for illustrating the present invention and not for limiting the present invention.

SYNTHETIC EXAMPLE

Synthesis of Meta- and Para-Novolak Resin

First, 45 g of m-cresol, 55 g of p-cresol, 65 g of formaldehyde, and 0.5 g of oxalic acid were put into a reactor having an overhead stirrer and a reflux condenser to make a reaction mixture. Subsequently, the reaction mixture was stirred to form a homogeneous mixture, heated to 95° C. for reaction, and kept for 4 hours. After the reaction is completed, the reflux condenser of the reactor was replaced with a distillation apparatus. Then, the temperature of the reaction mixture was increased to 110° C. and distilled for 2 hours to obtain a reaction product. The reaction product was purified by a vacuum distillation process at 180° C. for 2 hours to remove residual monomer in the reaction product. The obtained reaction product had a number average molecular weight of the novolak resin of 3500.

EXAMPLE 1

Forming a Photoresist Pattern 4 g of 2,3,4,4-tetrahydroxy benzophenone-1,2-naphtoquinonediazide-5-sulfonate as a photosensitive compound, 20 g of the novolak resin prepared from Synthetic Example as a polymer resin, 2 g of 2,3,4-trihydroxy benzophenone as a sensitivity enhancing agent, 1 g of 1,2-bis-phenyl para-toluene sulfonate as a sensitivity restraining agent, and 74 g of PGMEA as an organic solvent were mixed in a reactor at room temperature by stirring at 40 rpm to form a photoresist composition.

The photoresist composition was dropped on a glass substrate of 0.7T (thickness, 0.7 mm) and the glass substrate was rotated at a constant speed. Then, the glass substrate having the photoresist composition was heated to 115° C. for 90 seconds to form a photoresist layer having a thickness of 1.50 $\mu$m. A mask having a predetermined pattern was installed above the photoresist layer and the photoresist layer was exposed to ultraviolet. The glass substrate having the photoresist layer exposed to the ultraviolet was dipped into an aqueous solution of 2.38% tetramethyl ammoniumhydroxide for 60 seconds to remove an exposed portion of the photoresist layer to form a photoresist pattern.

EXAMPLE 2

Forming a Photoresist Pattern

A photoresist pattern was formed in the same way as described in Example 1, except that the photoresist composition was prepared by using 4,4'-[1-[4-[1-(1,4-hydroxyphenyl)-1-methyl ethyl]phenyl]ethylidene] bisphenol as the sensitivity enhancing agent instead of 2,3,4-trihydroxy benzophenone.

COMPARATIVE EXAMPLE 1

Forming a Photoresist Pattern

A photoresist pattern was formed in the same way as described in Example 1, except that the photoresist composition was prepared without the sensitivity enhancing agent.

COMPARATIVE EXAMPLE 2

Forming a Photoresist Pattern

A photoresist pattern was formed in the same way as described in Example 1, except that the photoresist composition was prepared without the sensitivity restraining agent.

COMPARATIVE EXAMPLE 3

Forming a Photoresist Pattern

A photoresist pattern was formed in the same way as described in Example 1, except that the photoresist composition was prepared without the sensitivity enhancing agent and the sensitivity restraining agent.

A. Estimation on the Sensitivity and the Residual Layer Characteristic

The sensitivity and the residual layer characteristic of each of the photoresist compositions prepared by Examples 1 and 2 and Comparative Examples 1–3 were measured and illustrated in Table 1.

The residual layer characteristic was calculated by equations (1) and (2). To obtain the residual layer characteristic, the thickness of each photoresist pattern was measured.

Initial thickness of a photoresist layer=thickness of loss+thickness of residual layer       [Equation 1]

Ratio of residual layer=(thickness of residual layer/initial thickness of the photoresist layer)       [Equation 2]

Sensitivity was obtained by measuring energy when the whole layer was dissolved according to the exposed energy when the developing condition was constantly maintained.

TABLE 1

| | Sensitivity enhancing agent | Sensitivity restraining agent | Sensitivity Eth(mJ/cm$^2$) | Ratio of Residual layer (%) |
|---|---|---|---|---|
| Example 1 | A | C | 8.4 | 91 |
| Example 2 | B | C | 8.5 | 90 |
| Comparative Example 1 | X | C | 13.6(?) | 94 (?) |
| Comparative Example 2 | A | X | 7.2 | 72 |
| Comparative Example 3 | X | X | 8.5 | 75 |

Note:
A: 2,3,4-trihydroxy benzophenone,
B: 4,4'-[1-[4-[1-(1,4-hydroxyphenyl)-1-methyl ethyl]phenyl]ethylidene] bisphenol,
C: 1,2-bis-phenyl para-toluenesulfonate Referring to Table 1, the sensitivity of Example 1 and 2 is substantially similar to that of Comparative Example 1, 2, and 3. Ratio of residual layer of Example 1 and 2 is higher than that of Comparative Example 2 or 3. Therefore, the photoresist layer formed by using the photoresist composition of the present invention exhibits even better physical properties than that formed by using the conventional photoresist composition. The sensitivity and the ratio of residual layer of Comparative Example 1 are even higher than those of Example 1 and 2. This means that the higher energy is needed for the formation of the desired photoresist pattern. Therefore, even though the ratio of residual layer is better than those of the Example 1 and 2, the higher energy is necessary for forming the photoresist pattern having the same characteristic. Accordingly, when the same energy is applied, i.e. the same sensitivity is applied, the exposing time should be lengthened for the case of Comparative Example 1.

B. Estimation on the Thickness Uniformity of the Photoresist Layer

A photoresist pattern was formed by using the photoresist composition prepared by Example 2. For comparison, HKT-6 (manufactured by Clariant Co. Ltd.) photoresist composition having a normal sensitivity (about half sensitivity of the photoresist composition of the present invention) was used.

The photoresist composition prepared by Example 2 and the HKT-6 photoresist composition were coated on a glass substrate by using a spin coating method, respectively. The photoresist composition prepared by Example 2 was coated to a thickness of 1.8 μm, while the HKT-6 photoresist composition was coated to a thickness of 1.5 μm. Each coated layer on the glass substrate was divided into 96 points and the layer thickness at each point was measured to determine the thickness uniformity on a large glass substrate as shown in Table 2. The layer thickness illustrated in Table 2 is a mean value for the 96 points. The layer uniformity was calculated by using the following equation (3) using the maximum thickness and the minimum thickness from the 96 points.

Thickness uniformity of photoresist layer=[(maximum thickness−minimum thickness)/(maximum thickness+minimum thickness)]×100       [Equation 3]

The thickness uniformity of the photoresist layer was controlled to be within ±2% of the thickness of the coated photoresist layer and the controlled range of the layer thickness is illustrated in Table 2.

TABLE 2

| | Example 2 | HKT-6 |
|---|---|---|
| Layer thickness (μm) | 1.77 | 1.48 |
| Layer uniformity(%) | 1.54 | 1.35 |
| Range(Å) | 540 | 400 |
| Control range(Å) | 720 | 600 |

Referring to Table 2, the thickness of both of the photoresist layers formed by using the photoresist composition prepared by Example 2 and th HKT-6 photoresist composition, are within the control range. Therefore, it was confirmed that the photoresist layer formed by using the photoresist composition of the present invention exhibits similar characteristics with that formed by the conventional photoresist composition.

C. Estimation on the Uniformity of the Critical Dimension when the Photoresist Composition is Applied to a Chrome Substrate The photoresist composition prepared by Example 2 and the commercially available and conventional photoresist composition (HKT-6) were coated on a chrome substrate (300×400 in size) by using a spin coating method to a thickness of 1.8 μm, respectively. After coating of two photoresist compositions, a soft bake process was performed at about 110° C. for about 90 seconds, respectively. Thereafter, the photoresist layer formed on the chrome substrate was exposed to light by using an exposure apparatus. The photoresist composition prepared by Example 2 was exposed for about 650 msec, while the conventional photoresist composition was exposed for about 1500 msec. Subsequently, the exposed substrate was dipped into an aqueous solution in which 2.38% of tetramethyl ammonium hydroxide was dissolved, to form a photoresist pattern. Critical dimensions (CD) of the photoresist patterns at five points on the substrate were measured to estimate the uniformity of the critical dimension within the substrate. The obtained results are illustrated in Table 3. Note that the values represent ADI CD (after development inspection on CD).

After developing, the substrate was dipped into a chrome etching solution to form a chrome pattern. The photoresist pattern was removed by using a stripper. Then, critical dimensions of the chrome pattern at the same five points on the substrate, where the ADI CDs have been measured, were measured to estimate the uniformity of the critical dimension within the substrate. The obtained results are illustrated in Table 4. Note that the values represent ACI CD (after cleaning inspection on CD).

TABLE 3

Results on measuring the critical dimension
(ADI CD) of the photoresist pattern after development
[Unit: $\mu$m]

| PR | Sub. no. | A | B | C | D | E | Mean | Range |
|---|---|---|---|---|---|---|---|---|
| Example 2 | 1 | 3.614 | 4.224 | 3.787 | 3.714 | 3.714 | 3.8106 | 0.610 |
|  | 2 | 3.641 | 4.005 | 3.641 | 3.714 | 3.641 | 3.7284 | 0.364 |
|  | 3 | 3.568 | 4.151 | 3.860 | 3.860 | 4.005 | 3.8888 | 0.583 |
| HKT-6 | 1 | 3.714 | 4.297 | 4.078 | 4.005 | 3.860 | 3.9908 | 0.583 |

*Note:
Experiments on three substrates were implemented for the photoresist composition prepared by Example 2, and "A", "B", "C", "D", and "E" represent predetermined positions on the substrate: "A" represents the center portion of the substrate; "B" represents the left and upper portion of the substrate; "C" represents the left and lower portion of the substrate; "C" represents the right and lower portion of the substrate; and "E" represents the right and upper portion of the substrate.

Referring to Table 3, the value of the reference critical dimension was 4 $\mu$m and the control range of the ADI CD was 3.5–4 $\mu$m.

TABLE 4

Results on critical dimension (ACI CD) of the chrome pattern after
performing the chrome etching and stripping of the photoresist layer
[Unit: $\mu$m]

| PR | Sub. no. | A | B | C | D | E | Mean | Range |
|---|---|---|---|---|---|---|---|---|
| Example 2 | 1 | 4.005 | 4.588 | 4.515 | 4.224 | 4.515 | 4.3694 | 0.583 |
|  | 2 | 4.005 | 4.734 | 4.297 | 4.151 | 4.297 | 4.2968 | 0.729 |
|  | 3 | 4.078 | 4.879 | 4.515 | 4.005 | 4.151 | 4.3256 | 0.874 |
| HKT-6 | 1 | 4.224 | 5.316 | 5.098 | 4.879 | 5.025 | 4.9084 | 1.092 |

TABLE 5

Differences between ACI CD and ADI CD of Tables 3 and 4
[Unit: $\mu$m]

| PR | Sub. no. | A | B | C | D | E | Mean | Range |
|---|---|---|---|---|---|---|---|---|
| Example 2 | 1 | 0.391 | 0.364 | 0.728 | 0.51 | 0.801 | 0.5588 | 0.437 |
|  | 2 | 0.364 | 0.729 | 0.656 | 0.437 | 0.656 | 0.5684 | 0.365 |
|  | 3 | 0.51 | 0.729 | 0.655 | 0.145 | 0.146 | 0.4368 | 0.583 |
| HKT-6 | 1 | 0.51 | 1.019 | 1.02 | 0.874 | 1.165 | 0.9176 | 0.655 |

This comparison of the critical dimensions was conducted to estimate the critical dimension change on the substrate to confirm the transferred degree of the photoresist pattern onto an underlying layer.

Referring to Tables 3–5, the uniformity of the critical dimension according to the measuring positions of the photoresist layer formed by using the photoresist composition prepared by Example 2 is better than that of the photoresist layer formed by using the conventional photoresist composition. That is, the uniformity of the photoresist pattern of the present invention is improved when comparing with the conventionally formed photoresist pattern. For the critical dimension measured after performing the etching, the chrome pattern formed by using the photoresist composition according to the present invention exhibits an improved uniformity when compared with that formed by using the conventional photoresist composition. In addition, the differences between the ADI CD and the ACI CD of the present invention is smaller than that of the conventional photoresist composition, thereby widening the processing margin for the fabricating a device.

When the photoresist pattern is formed by using the photoresist composition of the present invention, the uniformity of the critical dimension is improved even though the sensitivity of the photoresist composition of the present invention is similar to that of the conventional photoresist composition.

Therefore, when a photoresist pattern is formed by using the photoresist composition of the present invention, the sensitivity is improved to shorten the exposure time, thus productivity is improved. In addition, the decreasing phenomenon of the residual layer characteristic also can be improved by using the photoresist composition of the present invention. Furthermore, when forming a pattern for fabricating a circuit of liquid crystal display devices or semiconductor device by using the photoresist composition of the present invention, good sensitivity and residual layer characteristic are accomplished, and the shortening of the exposing time can improve the environmental working condition.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A photoresist composition comprising about 5% to about 30% by weight of a novolak resin, about 2% to about 10% by weight of a photosensitive compound, about 0.1% to about 10% by weight of a sensitivity enhancing agent, about 0.1% to about 10% by weight of a sensitivity restraining agent having a sulfonyl functional group, and about 60% to about 90% by weight of an organic solvent.

2. The photoresist composition as claimed in claim 1, wherein said novolak resin has a molecular weight in the range of about 2,000 to about 12,000.

3. The photoresist composition as claimed in claim 1, wherein the novolak resin is polymerized by reacting an aromatic alcohol compound with an aldehyde compound under an acid catalyst.

4. The photoresist composition as claimed in claim 3, wherein the aromatic alcohol compound is selected from the group consisting of phenol, m-cresol, p-cresol, o-cresol, xylenol, alkyl phenol, alkoxy phenol, isoprepenyl phenol, polyhydroxy phenol, and their mixtures.

5. The photoresist composition as claimed in claim 3, wherein the aldehyde compound is selected from the group consisting of formaldehyde, paraformaldehyde, acetaldehyde, propionaldehyde, butylaldehyde, trimethyl acetaldehyde, benzaldehyde, terephtalaldehyde, phenylacetaldehyde, hydroxybenzaldehyde, and their mixtures.

6. The photoresist composition as claimed in claim 3, wherein the acid catalyst is selected from the group consisting of inorganic acids of hydrochloric acid, hydrosulfuric acid, or phosphoric acid and organic acids of acetic acid, p-toluene sulfonic acid, or oxalic acid.

7. The photoresist composition as claimed in claim 1, wherein said photosensitive compound is a diazide-based compound.

8. The photoresist composition as claimed in claim 1, wherein said photosensitive compound is a sulfonate compound selected from the group consisting of 2,3,4,4'-tetrahydroxy beuzophenone- 1,2-naphtoquinone diazide-4-sulfonate, 2,3,4,4'-terahydroxy benzophenone-1,2-naphtoquinone diazide-5-sulfonate, 2,3,4,4'-tetrahydroxy benzophenone-1,2-naphtoquinone diazide-6-sulfonate, and their mixtures.

9. The photoresist composition as claimed in claim 8, wherein sulfonate compound is produced through an esterification reaction of 2,3,4,4'tetrahydroxy benzophenone with 1,2-naphtoquinone diazide.

10. The photoresist composition as claimed in claim 1, wherein said sensitivity enhancing agent is a polyhydroxy compound having about 2 to about 7 phenol-based hydroxy functional group and a molecular weight of about 1,000 or less.

11. The photoresist composition as claimed in claim 1, wherein said sensitivity enhancing agent is at least one compound selected from the group consisting of the following compounds of:

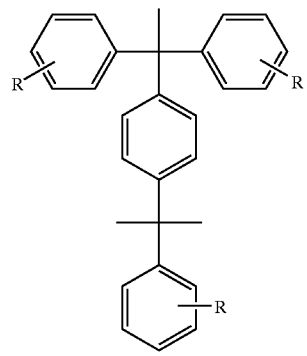

[I]

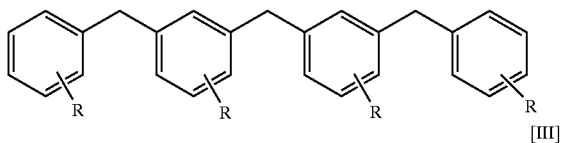

[II]

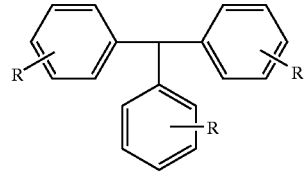

[III]

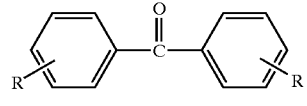

[IV]

[V]

wherein R is independently or simultaneously hydrogen, $(CH_3)_n$, $(CH_2CH_3)_n$, $(OH)_n$, or phenyl, and n is an integer of 0–5.

12. The photoresist composition as claimed in claim 11, wherein said sensitivity enhancing agent is at least one selected from the group consisting of 2,3,4-trihydroxy benzophenone, 2,3,4,4'-tetrahydroxy benzophenone, 2,3,4,3',4',5'-hexahydroxy benzophenone, acetone-pyrrogallol condensing compound, 4,4-[1-[4[1-(1,4-hydroxyphenyl)-1-methylethyl]phenyl]ethylidene]bisphenol, and 4,4-[2-hydroxyphenylmethylene]bis[2,6-dimethylphenol].

13. The photoresist composition as claimed in claim 1, wherein said sensitivity restraining agent is an aromatic compound having a molecular weight of about 1,000 or less.

14. The photoresist composition as claimed in claim 13, wherein said sensitivity restraining agent is at least one selected from the group consisting of the following compounds:

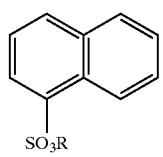

[VI]

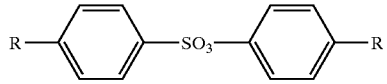

[VII]

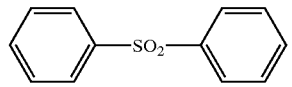

[VIII]

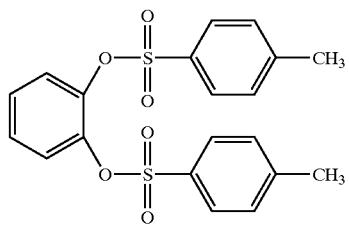

[IX]

wherein R is independently or simultaneously hydrogen, $(CH_3)_n$, $(CH_2CH_3)_n$, $(OH)_n$, $—SO_3(C_6H_4)CH_3$, or phenyl, and n is an integer of 0–5.

15. A photoresist composition as claimed in claim 14, wherein said sensitivity restraining agent is at least one selected from the group consisting of 1,2-bisphenyl paratoluenesulfonate, and diphenyl sulfone.

16. The photoresist composition as claimed in claim 1, wherein said organic solvent is a least one selected from the group consisting of propyleneglycol methylether acetate (PGMEA), ethyl lactate (EL), 2-methoxyethyl acetate (MMP), and propyleneglycol monomethyl ether (PGME).

17. The photoresist composition as claimed in claim 16, wherein said organic solvent is a mixture of propyleneglycol methylether acetate (PGMEA) and ethyly lactate (EL) in a ratio of about 9:1–7:3 by weight.

18. The photoresist composition as claimed in claim 1, further comprising at least one additive selected from the group consisting of a coloring agent, a dying agent, streation preventing agent, a plasticizer, an adhesion promoting agent, and a surfactant.

19. A method of forming a pattern comprising the steps of:
forming a photoresist layer of coating a photoresist composition on a substrate and then drying;
exposing the photoresist layer to a light by using a mask having a predetermined pattern; and forming a photoresist pattern by developing the exposed exposed photoresist layer, wherein the photoresist composition comprises about 5% to about 30% by weight of a novolak resin, about 2% to about 10% by weight of a photosensitive compound, about 0.1% to about 10% by weight of a sensitivity enhancing agent, about 0.1% to about 10% by weight of a sensitivity restraining agent having a sufonyl functional group, and about 60% to about 90% by weight of an organic solvent.

20. The method as claimed in claim 19, wherein the step of forming the photoresist layer comprises the step of performing a soft bake process at a temperature of about 80° C. to about 130° C.

21. The method as claimed in claim 19, wherein the step of forming the photoresist pattern comprises the step of performing a hard bake process at a temperature of about 90° C. to about 140° C.

22. The method as claimed in claim 19, wherein said photoresist composition is coated by a spin coating method.

23. The method as claimed in claim 19, wherein said sensitivity enhancing agent is at least one compound selected from the group consisting of the following compounds:

[I]

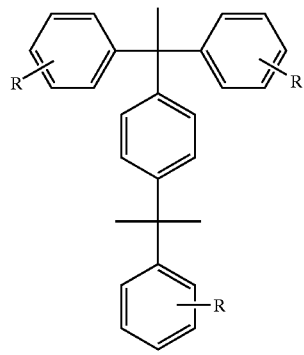

[II]

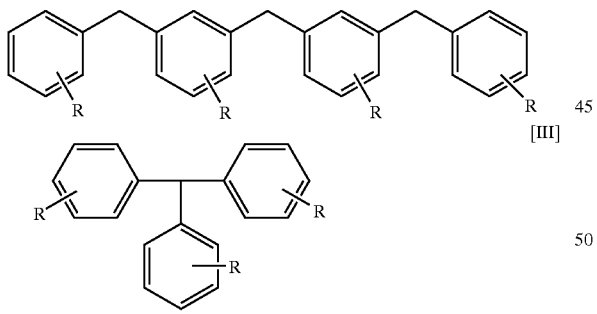

[III]

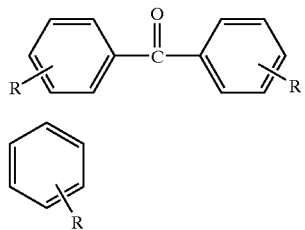

[IV]

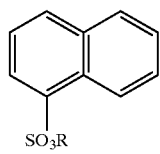

[V]

wherein R is independently or simultaneously hydrogen, $(CH_3)_n$, $(CH_2CH_3)_n$, $(OH)_n$, or phenyl, and n is an integer of 0–5.

24. The method as claimed in claim 19, wherein said sensitivity restraining agent is at least one selected from the group consisting of the following compounds:

[VI]

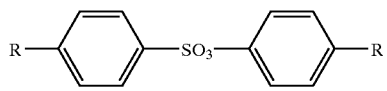

[VII]

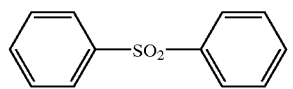

[VIII]

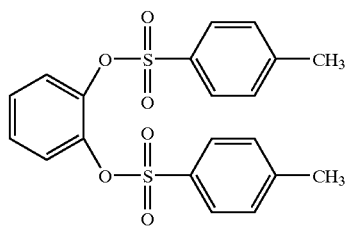

[IX]

wherein R is independently or simultaneously hydrogen, $(CH_3)_n$, $(CH_2CH_3)_n$, $(OH)_n$—$SO_3(C_6H_4)CH_3$, or phenyl, and n is an integer of 0–5.

25. The method as claimed in claim 19, wherein said novolak resin has a molecular weight in the range of about 2,000 to about 12,000.

* * * * *